Dec. 2, 1958 J. J. SURAN ET AL 2,863,070

DOUBLE-BASE DIODE GATED AMPLIFIER

Filed March 21, 1956

INVENTORS:
VERNON P. MATHIS,
JEROME J. SURAN,

BY [signature]
THEIR ATTORNEY

United States Patent Office 2,863,070

Patented Dec. 2, 1958

2,863,070

DOUBLE-BASE DIODE GATED AMPLIFIER

Jerome J. Suran and Vernon P. Mathis, Syracuse, N. Y., assignors to General Electric Company, a corporation of New York Application March 21, 1956, Serial No. 572,985

6 Claims. (Cl. 307—88.5)

This invention relates to gated amplifiers and has as a particular object thereof to provide a gated amplifier wherein a single semi-conductor device serves in both the amplifying and gating functions. A semiconductor device having suitable characteristics and exhibiting particular advantages in this gated amplifier is the "double-base diode."

The "double-base diode" has heretofore been described by Lesk, U. S. patent application, Serial No. 341,164 and Engel, U. S. patent application, Serial No. 373,828. The double-base diode is a three terminal semiconducting device having a single rectifying junction disposed intermediately between spaced ohmic electrodes. The physical characteristics of this device and its basic mode of operation are described in the above referenced patent applications. The ohmic electrodes of the double-base diode serve respectively as output and common electrodes while the rectifying junction serves as an input electrode. The double-base diode exhibits an input characteristic having three dissimilar regions. The first region, termed the cut-off region, is characterized by a steeply rising voltage or slope attributable to the fact that the input junction is poled to oppose input current flow. As the input voltage increases to a given peak value, established by the interbase potential, the junction bias is reversed, and a negative resistance region occurs. The initial downward slope of the negative resistance region is quite steep, but the slope decreases to zero at a "valley point," after which the slope becomes positive. The region beyond the valley point is termed the saturating region, and is characterized by a low positive resistance. In both the negative resistance region and in the initial portion of the saturating region, the double-base diode exhibits active properties, having current gain.

The gated amplifiers herein disclosed are particularly suited for selective switching of plural circuit signal transmissions. In such applications, present day double-base diodes are capable of handling signals with a bandwidth up to 1 megacycle, while bandwidths of 100 kc. are readily attained, and the devices are capable of being switched at a frequency of approximately one tenth these frequencies. As may well be appreciated, this signal bandwidth capacity and switching speed are more than adequate for use in standard telephone switching systems. When employed in a switching system requiring gated amplifiers, the double-base diode provides great simplification over a corresponding system employing vacuum tubes or transistors.

Accordingly, it is an object of the present invention to provide a greatly simplified gated amplifier circuit.

Still another object of the invention is to provide a novel gated amplifier network employing a single semiconducting device operative both as a gate and an amplifier.

A further object of the invention is to provide an improved gated amplifier having an on and on off condition, remaining stably in these conditions until transferred into the other condition by a momentary pulse.

These and other objects are achieved in a novel gated amplifier wherein a semiconductor device exhibiting a voltage-current input characteristic which rises to a peak, then descends to a valley point, and then rises slowly and exhibiting active properties in these last two regions is connected in circuit with a source of gating pulses of alternating polarity and a source of input signals for amplification. The semiconductor device in accordance with the invention, is connected in a circuit providing two points of stable operation, the first point being in the first rising region, and the second point occurring near the valley point. The source of gating pulses provides a pulse for gating the amplifier off and a pulse for gating the amplifier on, the magnitude of the latter pulse exceeding the voltage difference between the first operating point and said peak point thus switching the device to the second operating point. The source of input signals provides signals for amplification whose maximum magnitude is insufficient to switch the amplifier from one condition to another. When operation occurs in the rising portion of the valley region, the maximum signal amplitude is preferably less than the voltage difference between the second point of operation and the valley point, thus preventing oscillation or accidental switching to the first operating point.

In a first embodiment of the invention, a double-base diode is employed having both the gating pulse source and the signal source coupled to the rectifying junction and the same ohmic electrode of a double-base diode semiconductor device.

In a second embodiment of the invention, the signal source is coupled between a rectifying junction and ground, whereas the source of gating pulses is connected to the primary winding of a transformer whose secondary is connected in series between the common ohmic electrode and ground.

The features of the invention which are believed to be novel are set forth with particularity in the appended claims. The invention itself, however, both as to its organization and method of operation, together with further objects and advantages thereof may best be understood by reference to the following description when taken in connection with the following drawings, wherein:

Figure 1:
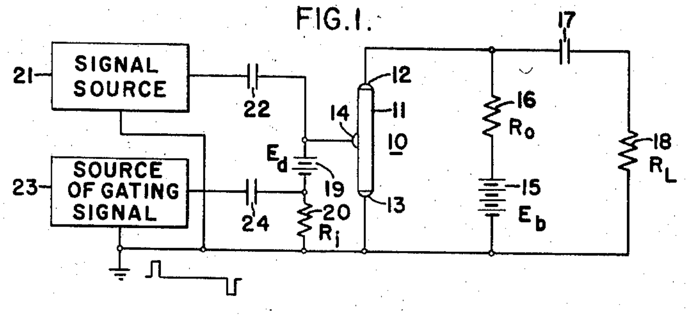
Figure 1 illustrates schematically one embodiment of the invention.

Referring now to Figure 1, there is shown a gated amplifier employing a double-base diode 10. The double-base diode 10 is formed of an elongated bar 11 of N-type germanium, achieved by an admixture of a donor impurity of antimony. The double-base diode is further provided with electrodes 12 and 13 affixed to the respective ends of the bar 11 and an intermediate rectifying junction 14 established between the ends of the bar. The electrodes 12 and 13 conduct current to and from the bar 11 without introducing appreciable rectifying properties, tin being chosen because of its predominantly bilateral or ohmic conductive properties when applied to germanium. The rectifying junction 14 is established on the bar by the application of indium, an acceptor-type of impurity. The indium is diffused into the bar by known alloying techniques.

The region between the junction electrode 14 and the ohmic electrode 13 is generally referred to as the base-one region and that between the junction electrode 14 and the ohmic electrode 12 as the base-two region. In establishing the base-one region, it should be noted that the input characteristics exhibited between the junction 14 and the base-one electrode 13 are controlled by selection of the physical parameters of the region, as more fully described in the above-referenced applications, the dimension of separation being chosen as less than the diffusion distance for minority charge carriers. In general, the axial placement of the rectifying junction with respect to the base-one electrode largely affects the gain, while the distance between ohmic electrodes controls the upper frequency limits of operation.

The double-base diode 10 is energized by a uni-directional voltage source 15 ($E_b$) having its positive terminal connected through a resistance 16 ($R_o$) to the base-two electrode 12 of the double-base diode. The negative terminal of the source 15 is connected to the base-one electrode 13 so as to provide an inter-base potential gradient. A signal output circuit is provided consisting of a coupling capacitor 17 connected in series with a load resistance 18 ($R_L$) in the order recited between base electrodes 12 and 13.

Input voltages and bias potentials are applied between the rectifying junction electrode 14 and the base-one electrode 13. The input bias is provided by a battery 19 ($E_d$) having its positive terminal connected to the rectifying junction 14 and its negative terminal connected through a resistance 20 ($R_1$) to the base-one ohmic electrode 13. The output terminals of the signal source 21 are connected respectively through a capacitor 22 to the electrode 14 and to base-one electrode 13. The output terminals of the gating signal source 23 are connected respectively through a coupling capacitor 24 to the junction between source 19 and resistance 20, and to the base-one electrode 13.

The embodiment illustrated in Figure 1 has been found to exhibit a signal power gain of approximately 10 decibels when the operating potentials and circuit parameters are properly chosen. In one experimental circuit, employing a double-base diode of antimony doped germanium, the doping was of such a concentration as to produce a resistivity of approximately 20 ohm-centimeters. The germanium bar was approximately 0.030 inch long and had a cross section of 0.005 inch by 0.005 inch. Source 15 was 12 volts and source 19 was 3 volts. The maximum signal source (21) potential was approximately 0.025 volt, and the gating source (23) potential was approximately 2 volts succeeding pulses being of opposite polarity. The circuit parameters were as follows:

| | | |
|---|---|---|
| Resistance **16** ($R_o$) | ohms | 1,000 |
| Capacitance **17** | microfarads | 0.01 |
| Resistance **18** ($R_L$) | ohms | 5,000 |
| Resistance **20** ($R_1$) | do | 1,000 |
| Capacitance **22** | microfarads | 0.001 |
| Capacitance **24** | do | 0.01 |

The values of these circuit parameters are, of course, exemplary, and the invention should not be considered as limited thereto. While these values are appropriate in one operative embodiment, it should be made clear that other values may be chosen without departing from the invention, as when a double-base diode having different characteristics is used, or as when a different sensitivity to triggering pulses is desired.

The operation of the embodiment of the invention shown in Figure 1 may be briefly outlined. The double-base diode 10, as connected, has two stable conditions of operation: one in which signals of appropriate magnitude are attenuated, and one in which such signals are amplified. Signals of prescribed magnitude (in this embodiment, of approximately 0.025 volt maximum excursion) are accordingly applied from the source 21 between the rectifying junction 14 and the base-one electrode 13 of the double-base diode. When the double-base diode is gated into the on condition near the valley region, by application of a voltage pulse of approximately 2 volts, an amplified version of the applied signal is produced between the ohmic electrodes, being derived in load resistance 18. When the double-base diode is not gated on, and is in the first condition of operation, the signal is greatly attenuated in the double-base diode 10, and does not appear in the load resistance 18.

Figure 2:
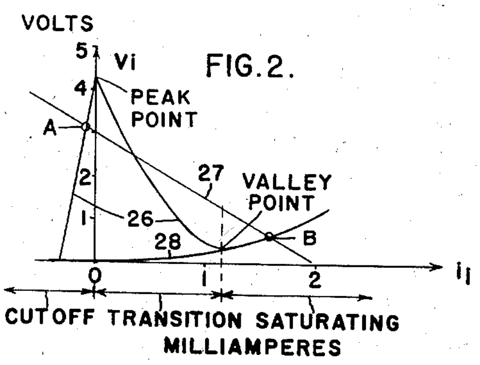
Figure 2 illustrates the input characteristic of an N-type double-base diode.

For a more thorough understanding of the invention, a more extended explanation thereof is given with reference to Figure 2 wherein the input characteristics of a double-base diode are illustrated. In Figure 2 accordingly, the input voltage ($V_1$) is plotted at 26 as a function of the input current ($i_1$). In this plot three distinct operating regions are shown; a cutoff region, a transition region, and a saturating region. The cutoff region corresponds to the condition in which the rectifying junction 14 is biased in its reverse direction and the slope of the input characteristic in this region is effectively equal to the junction's back resistance. A typical range of values of this resistance for experimental germanium units is approximately 50,000 to 200,000 ohms.

The transition, or negative resistance region is explained as being due to the resistance modulation of the base-one portion of the bar by the injected minority carriers. A typical observed value for the negative resistance in experimental germanium devices is 1,000 ohms. When the input current ($i_1$) becomes sufficiently large, the base-one modulation effect is said to decrease and the observed input resistance tends toward the positive value of a rectifying junction biased in its forward direction. This last part of the characteristic has been termed the saturating region. The point of minimum resistance is termed the valley point. Typical observed values for the input resistance in the saturating region are 0 to 20 ohms. In the transition region the current gain is quite high decreasing steadily as one goes into the saturating region.

In accordance with the invention, the three region characteristic of the double-base diode may be used to advantage in providing a gated amplifier. Appropriate conditions for such operation are graphically illustrated in Figure 2, the voltage difference between point B and the valley point being exaggerated for clarity. A desirable input load line 27 is shown intersecting the cutoff region of the characteristic at the point A and the saturating region of the characteristic at the point B. The slope of the load line 27 is controlled by the magnitude of resistance 20 ($R_1$) and its intercept along the input voltage axis is equal to the potential of the source 19 ($E_d$).

The points A and B are the two stable operating points to which reference was previously made. The amplitude of the pulse available from the source 23 controls the selection of the point A. Point A is selected so that the sum of the input voltage corresponding to the point A and the peak voltage of the triggering pulse exceeds the voltage at the peak point. The signal amplitude from the source 21 has somewhat less effect on the selection of the point A since the signal amplitude from the source 21 is relatively small. The signal amplitude from the source 21 must never exceed the pulse from the source 23, and the sum of the voltage corresponding to the point A and the maximum excursion of the signal must never exceed the peak point of the double-base diode characteristic. Control of the sources 21 and 23 with respect to the operating point A insures that the amplifier is gated to the on condition, only in response to a desired gating pulse and never accidentally gated on by the signal.

Point B is likewise dependent upon the selection made of the sources 21 and 23. While the point B must be chosen within the valley region, where the current gain is substantial as contrasted to the outer extremities of the saturating region, it should also correspond to an input voltage exceeding the voltage at the valley point by a value equal to the maximum voltage of the signal supplied by the source 21 in order to provide reasonable stability. This latter requirement may be restated as a requirement that the signal never reduce the input current below the valley point. Satisfaction of this requirement, prevents accidental triggering off of the double-base diode to the cutoff condition by signal voltages. More linear signal amplification dictates a somewhat lower amplitude signal with respect to a given selection of point B. The pulse which cuts off the amplifier must have a voltage greater than the voltage difference between the point B and the valley point, and satisfy a minimum charge requirement sufficient to cause entry of the amplifier upon the decay portion 28 of the curve shown in Figure 2.

It may now be observed that the source 23 is required to supply a positive pulse to gate the amplifier on and a negative pulse to gate the amplifier off. As an examination of Figure 2 will indicate, the magnitude of the positive pulse must be slightly in excess of one volt. Since the currents which are involved are of a low order, the energy content of the gating-on pulse is also very small. The negative pulse, which is used to turn the amplifier off, need not be of so great a magnitude, the graph in Figure 2 indicating that the voltage may be considerably less than 1 volt. However, because of the relatively high magnitude currents which are involved, the current content of this pulse must be somewhat greater than the corresponding turn on pulse.

The circuit illustrated in Figure 1 has been observed to amplify the signal applied by the source with a power gain of 10 decibels. The mechanism of power amplification may be explained as a modulation of the resistance of the base-one region by minority carriers which are injected at the junction 13, by the input current ($i_i$). Accordingly, the base-one region, by virtue of both an A. C. signal applied from the rectifying junctions 14 and a D. C. interbase bias, may be thought of as containing both an A. C. component of input current and a D. C. component. These considerations lead one to rationalize the operation of the double-base diode in the saturating region, where such amplification is observed, in terms of the T-equivalent circuit illustrated in Figure 3 wherein the input branch comprises a resistance $r_j$, corresponding to the junction resistance, the output branch comprises a resistance $r_{b2}$, corresponding to the base-two resistance, and the vertical branch comprises a resistance $r_{b1}$ corresponding to the base-one resistance, shunted by a current generator having a magnitude $\gamma i_i$, where $\gamma$ (gamma) is the internal current amplification factor, observed to have a value of approximately 1.5, and $i_i$ is the input current. The load $R_L$, is coupled to the ends of the output and common branches.

Figure 3:
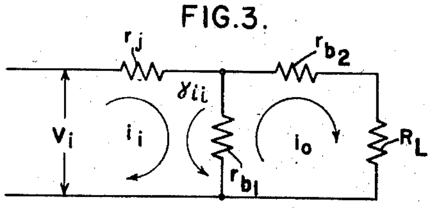
Figure 3 illustrates an equivalent circuit for a double-base diode.

A solution of the voltage and current relationships of the T-network shown in Figure 3 leads to the following expression for the current transfer ratio ($A_i$):

$$A_i=\frac{i_o}{i_i}=\frac{\gamma-1}{1+\frac{r_{b2}+R_L}{r_{b1}}} \qquad (1)$$

where $i_o$ is the output current. Substituting typical values:

| | | |
|---|---|---|
| $\gamma$ | | 1.5 |
| $r_j$ | ohms | 24.101 |
| $r_{b1}$ | do | 50 |
| $r_{b2}$ | do | 500 |
| $R_L$ | do | 800 |

$$A_i=\frac{0.5}{1+\frac{500+800}{50}}=\frac{1}{54}=0.0185 \qquad (2)$$

The input resistance ($r_{in}$) has the following value:

$$r_{in}=\frac{v_i}{i_i}=r_j+r_{b1}(1-\gamma)\frac{r_{b2}+R_L}{r_{b1}+r_{b2}+R_L} \qquad (3)$$

Substituting:

$$r_{in}=24.101+50(1-1.5)\frac{500+800}{50+500+800}$$
$$=24.101-24.074$$
$$r_{in}=0.027 \text{ ohms}$$

The power gain (G) may then be calculated:

$$G=A_i^2\frac{R_L}{r_{in}}$$
$$=\left(\frac{1}{54}\right)^2\frac{800}{0.027} \qquad (4)$$
$$G=10.2\sim 10DB$$

A power gain of 10 decibels is typical. In experimental arrangements, power gains of from 8 to 14 decibels have been observed. The parameters, upon which the above calculation was based, are greatly affected by selection of the operating point. Accordingly, an experimental approach is often dictated in achieving an arrangement wherein the power gain is maximized. Expression 3 giving the value of the input resistance, indicates that the dynamic input resistance goes through a zero region, which is found to correspond to the valley point. At this point, the power gain indicated by Expression 4 should be infinite theoretically. Experimental evidence, when one operates the amplifier near the valley point, indicates an increase in gain, accompanied by substantial non-linearity. Accordingly, to provide undistorted amplification of both the positive going and negative going portions of this signal, the excursions of the signal should be removed from too close proximity to the valley point, in establishing the operating point of the amplifier.

Figure 4:
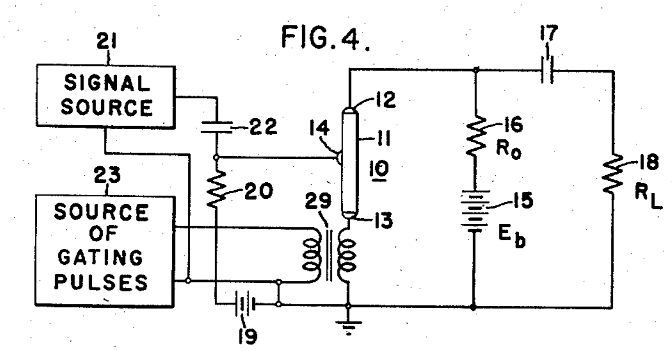
Figure 4 is an illustration of another embodiment of the invention.

A second embodiment of the invention is shown in Figure 4. The embodiment in Figure 4 is in most respects similar to that illustrated in Figure 1, the difference being in the manner in which gating of the amplifier is achieved. In the embodiment shown in Figure 4, the source of gating pulses 23 is coupled to the primary windings of transformer 29, whose secondary winding is inserted between the base-one electrode 13 and the ground. The operating biases of the two double-base diodes in Figures 1 and Figures 4 are the same. The requirements for the magnitudes of the outputs from the signal source 21 and the source 23 of gating pulses are dictated by the same requirements as before, but taking into account the transformation ratio of transformer 29.

Figure 5:
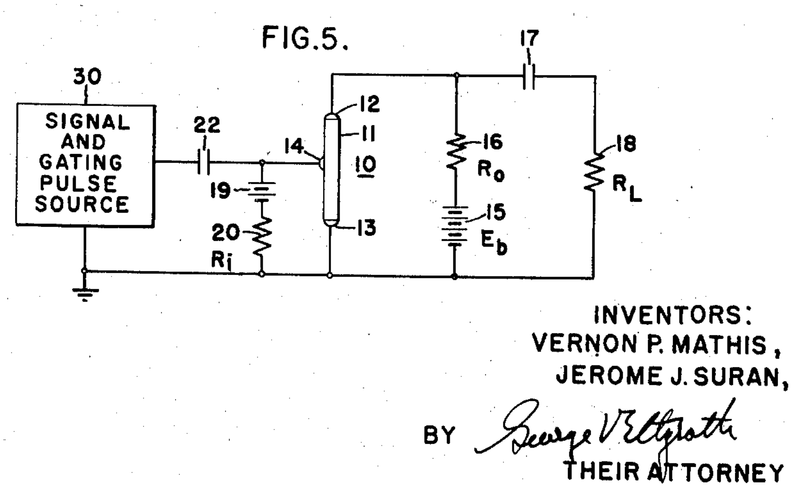
Figure 5 is an illustration of a third embodiment of the invention.

Of particular interest is the feature that the amplifier is stable at either the on or off conditions, only requiring a momentary pulse to transfer it from one condition to another. This feature is not only of great intrinsic interest, but also it permits the amplifier to be used with a composite source which generates a signal accompanied by pulses for turning the amplifier to on condition just prior to the signal and turning it to the off condition just subsequent to the signal, providing the previously indicated requirements for the signal source and gating pulse source are satisfied. Figure 5 illustrates such an embodiment, wherein the single source 30 provides both the gating pulses and the signal. The other components are chosen as in Figure 1 and bear similar reference numerals.

In the three embodiments illustrated, the operating point was selected in the rising or saturating region just beyond the valley point. The selection of the saturating region as against the downward sloping or transition region is often dictated for reasons of stability. Operation of the amplifier in the transition region is also possible when suitable measures are taken to avoid instability. The advantages of operation in the transition region are that the current gain ($\gamma$) is somewhat higher, and the frequency response improved. Operation in this region involves merely a readjustment of the second operating point through parameter adjustment and involves no changes in circuit configuration. Instability can often be avoided by minimizing the stray capacity appearing between the rectifying junction 14 and the base-one electrode 13. Operation in the general area of the valley point, where the negative slope is reduced, provides somewhat more stable operation than operation nearer the peak point. When adequate measures are taken to insure stability in the negative resistance region, one need not avoid dynamic conditions which would cause crossing of the valley point during signal amplification. It may thus be seen that operation in the valley region, whether to the left or to the right of minimum is generally desirable.

The inventive embodiments so far described have related to gated amplifier circuits employing a double-base diode using an N-type bar upon which the bilateral electrodes and P-type rectifying junction are fixed. Upon reversing the polarity of the bias potentials, one may also employ a double-base diode in which the bar is of P-type material and in which the rectifying junction is of N-type. Semiconductor devices having slightly different characteristics may be employed to good effect in applicant's gated amplifier so long as the three region characteristic indicated particularly in Figure 2 is exhibited and the semiconductor retains its active properties in the valley region.

While particular embodiments of the invention have been shown and described, it should be understood that the invention is not limited thereto, and it is intended in the appended claims to claim all variations as fall in the true spirit of the present invention.

What I claim as new and desire to secure by Letters Patent of the United States is:

1. In combination, a three terminal semiconductor device having a body of semiconductor material, a pair of spaced ohmic connections on said body, one connection serving as an output terminal, and the other as a common terminal, and a rectifying junction placed intermediately of said ohmic connections providing an input terminal, said device exhibiting a voltage-current input characteristic which rises to a peak, then descends to a minimum in a valley region, and then rises slowly, said device having current gain in said valley region, biasing means for establishing two points of stable operation for said device, said first point being in said first rising region, and said second point lying in said valley region, gating means coupled between said input terminal and said common terminal supplying a pulse of a first polarity for transferring said device from said first point to said second point of operation and a pulse of an opposite polarity for transferring said device from said second point to said first point of operation a source of input signals coupled between said input and common terminals, supplying signals which are ineffective to transfer said device from one of said points to the other, and output means coupled to said semiconductor device adapted to supply a modified input signal as developed in said device during the time said device is in said second point of operation.

2. In combination, a three terminal semiconductor device having a body of semiconductor material, a pair of spaced ohmic connections on said body, one connection serving as an output terminal, and the other as a common terminal, and a rectifying junction placed intermediately of said ohmic connections providing an input terminal, said device exhibiting a voltage-current input characteristic which rises to a peak, then descends to a minmum in a valley region, and then rises slowly, said device having current gain in said valley region, biasing means for establishing two points of stable operation for said device, said first point being in said first rising region, and said second point lying in the rising portion of said valley region, gating means coupled between said input terminal and said common terminal supplying a pulse of a first polarity for transferring said device from said first point to said second point of operation and a pulse of an opposite polarity for transferring said device from said second point to said first point of operation, a source of input signals coupled between said input and common terminal, supplying signals which are ineffective to transfer said device from one of said points to the other, and output means coupled to said semiconductor device adapted to supply the amplified input signal developed in said device during the time said device is in said second point of operation.

3. In combination, a three terminal semiconductor device having a body of semiconductor material, a pair of spaced ohmic connections on said body, one connection serving as an output terminal, and the other as a common terminal, and a rectifying junction placed intermediately of said ohmic connections providing an input terminal, said device exhibiting a voltage-current input characteristic which rises to a peak, then descends to a minimum in a valley region, and then rises slowly, said device having current gain in said valley region, biasing means for establishing two points of stable operation for said device, said first point being in said first rising region, and said second point, corresponding to a lower input voltage than said first point, lying in the rising portion of said valley region, gating means coupled between said input terminal and said common terminal supplying a first pulse of a first polarity for transferring said device from said first point to said second point of operation and a second pulse of an opposite polarity for transferring said device from said second point to said first point of operation, a source of input signals coupled between said input and common terminals, supplying signals which have a maximum amplitude which is less than the input voltage difference between said second point and said valley point and are ineffective to transfer said device from one of said points to the other, and output means coupled to said semiconductor adapted to supply an amplified input signal developed in said device during the time the device is in said second point of operation subsequent to the termination of said first pulse until the initiation of said second pulse.

4. In combination, a three terminal semiconductor device having a body of semiconductor material, a pair of spaced ohmic connections on said body, one connection serving as an output terminal, and the other as a common terminal, and a rectifying junction placed intermediately of said ohmic connections providing an input terminal, said device exhibiting a voltage-current input characteristic which rises to a peak, then descends to a minimum in a valley region, and then rises slowly, said semiconductor device having a current gain in said valley reigon, biasing means for establishing two points of stable operation for said device, said first point lying in said first rising region, and said second point lying in said valley region, gating means supplying a pulse of a first polarity for transferring said device from said first point to said second point of operation and a pulse of an opposite polarity for transferring said device from said second point to said first point of operation, a transformer having an input winding coupled to the output of said gating means and having an output winding one output terminal of which is connected to the common terminal of said semiconductor device and having the other output terminal connected to one side of said input winding, and a source of input signals, supplying signals which are ineffective to transfer said device from one of said points to the other, coupled to said input terminal of said semiconductor device and to said one side of said input winding, and output means coupled to said semiconductor device adapted to supply an amplified input signal developed in said device during the time said device is in said second point of operation.

5. In combination, a three terminal semiconductor device having a body of semiconductor material, a pair of spaced ohmic connections on said body, one connection serving as an output terminal, and the other as a common terminal, and a rectifying junction placed intermediately of said ohmic connections providing an input terminal, said device exhibiting a voltage-current input characteristic which with increasing current first rises to a peak, then descends to a minimum in a valley region, and then rises slowly, said semiconductor device having a current gain in said valley region, biasing means for establishing two points of stable operation for said device, said first point lying in said first rising region, and said second point lying in said valley region, gating means supplying a pulse of a first polarity for transferring said device from said first point to said second point of operation and a pulse of an opposite polarity for transferring said device from said second point to said first point of operation, said gating means having one of its two output terminals connected to the common terminal of said semiconductor device, means connecting the other of the output terminals to the input terminal of said semiconductor device, a source of input signals supplying signals which are ineffective to transfer said device from one of said points to the other, having one of its output terminals coupled to said input terminal of said semiconductor device, and the other of its output terminals connected to the common terminal of said semiconductor device, and output means coupled to said semiconductor device adapted to supply the modified input signal developed in said device during the time said device is in said second point of operation.

6. In combination, a three terminal semiconductor device having a body of semiconductor material, a pair of spaced ohmic connections on said body, one connection serving as an output terminal, and the other as a common terminal, and a rectifying junction placed intermediately of said ohmic connections providing an input terminal, said device exhibiting a voltage-current input characteristic which rises to a peak, then descends to a minimum in a valley region, and rises slowly, said semiconductor device having a current gain in said valley region, biasing means for establishing two points of stable operation for said device, said first point lying in said first rising region, and said second point lying in said valley region, wave source means coupled between said input terminal and said common terminal constructed to provide a signal preceded by a pulse of one polarity for transferring said device from said first point to said second point of operation and succeeded by a pulse of opposite polarity for transferring said device back from said second point to said first point of operation, said signal being ineffective to transfer said device from one of said points to the other, and output means coupled to said semiconductor device adapted to supply the amplified input signal developed in said device during the time said device is in said second point of operation.

References Cited in the file of this patent

UNITED STATES PATENTS

| | | |
|---|---|---|
| 2,502,479 | Pearson et al. | Apr. 4, 1950 |
| 2,627,039 | MacWilliams | Jan. 27, 1953 |
| 2,644,896 | Lo | July 7, 1953 |
| 2,670,445 | Felker | Feb. 23, 1954 |
| 2,681,993 | Shockley | June 22, 1954 |
| 2,702,838 | Haynes | Feb. 22, 1955 |

OTHER REFERENCES

Article on Double-Base Diodes by J. J. Suran, Electronics, March 1955, p. 199.